United States Patent
Dvorsky et al.

(10) Patent No.: US 6,759,297 B1
(45) Date of Patent: Jul. 6, 2004

(54) LOW TEMPERATURE DEPOSITION OF DIELECTRIC MATERIALS IN MAGNETORESISTIVE RANDOM ACCESS MEMORY DEVICES

(75) Inventors: Edward Frank Dvorsky, Mondovi, WI (US); Fred J. Wagener, Eau Claire, WI (US)

(73) Assignee: Union Semiconductor Technology Corporatin, Plymouth, MN (US)

(*) Notice: Subject to any disclaimer, the term of this patent is extended or adjusted under 35 U.S.C. 154(b) by 0 days.

(21) Appl. No.: 10/377,510

(22) Filed: Feb. 28, 2003

(51) Int. Cl.⁷ ............................................. H01L 21/336
(52) U.S. Cl. .................... 438/257; 438/626; 438/645
(58) Field of Search ............................... 438/257, 626, 438/634, 645, 671, 749

(56) References Cited

U.S. PATENT DOCUMENTS

| | | | |
|---|---|---|---|
| 4,264,393 A | 4/1981 | Gorin et al. ............... 156/345 | |
| 5,235,400 A | 8/1993 | Terasawa et al. | |
| 5,316,896 A | 5/1994 | Fukuda et al. | |
| 5,362,526 A | 11/1994 | Wang et al. ................. 427/573 | |
| 5,491,724 A | 2/1996 | Altes | |
| 5,593,919 A * | 1/1997 | Lee et al. .................... 438/626 | |
| 5,597,868 A | 1/1997 | Kunz | |
| 5,638,211 A | 6/1997 | Shiraishi | |
| 5,700,601 A | 12/1997 | Hasegawa et al. | |
| 5,866,935 A | 2/1999 | Sogard | |
| 5,891,959 A | 4/1999 | Kunz | |
| 5,914,774 A | 6/1999 | Ota | |
| 5,936,293 A | 8/1999 | Parkin ........................ 257/422 | |
| 5,940,319 A | 8/1999 | Durlam et al. .............. 365/171 | |
| 5,973,316 A | 10/1999 | Ebbesen et al. | |
| 6,002,740 A | 12/1999 | Cerrina et al. | |
| 6,005,682 A | 12/1999 | Wu et al. | |
| RE36,509 E | 1/2000 | Shigihara | |
| 6,040,936 A | 3/2000 | Kim et al. | |
| 6,052,238 A | 4/2000 | Ebbesen et al. | |
| 6,153,443 A | 11/2000 | Durlam et al. ................. 438/3 | |
| 6,211,090 B1 | 4/2001 | Durlam et al. .............. 438/692 | |
| 6,236,033 B1 | 5/2001 | Ebbesen et al. | |
| 6,238,751 B1 | 5/2001 | Mountsier .................... 427/574 | |
| 6,240,219 B1 | 5/2001 | Gregory | |
| 6,258,653 B1 | 7/2001 | Chew et al. ................. 438/239 | |
| 6,278,101 B1 | 8/2001 | Puyot | |
| 6,285,020 B1 | 9/2001 | Kim et al. | |
| 6,326,321 B1 | 12/2001 | DeBoer et al. .............. 438/791 | |
| 6,329,112 B1 | 12/2001 | Fukuda et al. | |
| 6,331,494 B1 | 12/2001 | Olson et al. ................. 438/770 | |
| 6,331,944 B1 | 12/2001 | Monsma et al. ............. 365/171 | |
| 6,358,756 B1 | 3/2002 | Sandhu et al. ................. 438/3 | |
| 6,360,012 B1 | 3/2002 | Kreuzer | |
| 6,362,907 B1 | 3/2002 | Stone et al. | |
| 6,368,763 B2 | 4/2002 | Drksen et al. | |
| 6,376,371 B1 | 4/2002 | Jain et al. .................... 438/681 | |
| 6,449,132 B1 | 9/2002 | Yang et al. .................. 360/317 | |
| 6,451,490 B1 | 9/2002 | Advocate et al. | |
| 6,459,823 B2 | 10/2002 | Altunbasak et al. | |
| 6,468,384 B1 | 10/2002 | Singh et al. ............. 156/345.27 | |
| 6,483,172 B1 | 11/2002 | Cote et al. ................... 257/639 | |

(List continued on next page.)

FOREIGN PATENT DOCUMENTS

WO     WO 00/59206     10/2000

OTHER PUBLICATIONS

"Extraordinary optical transmission through sub–wavelength hole arrays", Ebbesen et al., Nature, vol. 391, Feb. 1998, pp., 1994, pp. 667669.

(List continued on next page.)

*Primary Examiner*—Phuc T. Dang
(74) *Attorney, Agent, or Firm*—Jones Day (57) ABSTRACT

The invention provides a low temperature process for depositing silicon nitride or silicon dioxide dielectric films over magnetically active materials in the manufacture of MRAM devices and MRAM devices produced by the method.

34 Claims, 5 Drawing Sheets

U.S. PATENT DOCUMENTS

| | | |
|---|---|---|
| 6,485,989 B1 | 11/2002 | Signorini ..................... 438/3 |
| 6,492,267 B1 | 12/2002 | Yin et al. ................... 438/687 |
| 6,500,772 B2 | 12/2002 | Chakravarti et al. ........ 438/789 |
| 6,503,557 B1 | 1/2003 | Joret ......................... 427/167 |
| 6,515,272 B1 | 2/2003 | Fontaine et al. |
| 6,534,798 B1 | 3/2003 | Scherer et al. |
| 2002/0105629 A1 | 8/2002 | Sandstrom et al. |
| 2002/0122187 A1 | 9/2002 | Bruce et al. |
| 2002/0134912 A1 | 9/2002 | Veneklasen et al. |
| 2002/0145717 A1 | 10/2002 | Baselmans et al. |
| 2002/0167651 A1 | 11/2002 | Boonman et al. |
| 2002/0172876 A1 | 11/2002 | Baselmans |
| 2002/0192598 A1 | 12/2002 | Hirayanagi |
| 2003/0001107 A1 | 1/2003 | Kroon et al. |
| 2003/0017605 A1 | 1/2003 | Yeung et al. |
| 2003/0027057 A1 | 2/2003 | Schroeder et al. |
| 2003/0027366 A1 | 2/2003 | Dulman et al. |
| 2003/0042433 A1 | 3/2003 | Kamijo |
| 2003/0047694 A1 | 3/2003 | Van Der Lean |

OTHER PUBLICATIONS

"Initial Experiments on Direct Aerial Image Measurements in the Extreme Ultraviolet", Fields et al., Proc. OSA Trends in Optics and Photonics, Extreme Ultraviolet Lithography, Boston, NA, 1996.

"A Transmission X–Ray Microscope Based on Secondary–Electron Imaging", Watts et al., Rev. Sci. Instrum., vol. 68, No. 9, Sep. 1997, pp. 3464–3476.

"Scanning Probe Lithography Using a Cantilever with Integrated Transistor for On–chip Control of the Exposing Current", Wilder and Quate, Journal of Vacuum Science and Technology B, vol. 17, No. 6, Nov./Dec. 1999, pp. 3256–3261.

The Nanodetector; An Extreme Ultraviolet Conversion Microscope, 2 pages, Online: May 1998.

PEEM Product Literature, Staib Instruments, Nov. 5, 2001, 8 pages.

Omicron Product Literature, Focus, Date unknown, 12 pages.

"Race to Build Third Generation Photoemission Electron Microscope", Science Beat, Berkeley Lab., Jul. 5, 2001, 4 pages.

"Imagerie en photoemission de haule resolution spatiale (PEEM)", Vogel et al., Mar. 28, 2001, 3 pages.

"A Multi–Blanker for Parallel Electron Beam Lithograph", G. Winograd, Ph.D. Dissertation, Stanford University, May, 2001.

"Ultra–low Energy Electron Optics for Lithography and Microscopy", L. Hordon, Ph.D. Dissertation, Stanford University, Jun., 1994.

"Control of Optical Transmission Through Metals Perforated with Subwavelength Hole Arrays", Kim et al., Optics Letters, vol. 24, No. 4, Feb., 1999, pp. 256–258.

"Image Monitor for Markle–Dyson Optic", Grenville et al., Journal of Vacuum Science Technology B, vol. 6, No. 11, Nov./Dec. 1993, pp. 2700–2704.

"A General Simulator for VLSI Lithography and Etching Processes: Part I—Application to Projection Lithography", Oldham et al., IEEE Transactions on Electron Devices, vol. ED–26, No. 4, Apr. 1979, pp. 717–722.

"High–Resolution Lithography with Projection Printing", H. Moritz, IEEE Transactions on Electron Devices, vol. ED–26, No. 4, Apr. 1979, pp. 705–710.

"Contrast Studies in High–Performance Projection Optics", Oldham et al., IEEE Transactions on Electron Devices, vol. ED–30, No. 11, Nov. 1983, pp. 1474–1479.

"High Resolution, Low–Voltage Probes from a Field Emission Source Close to the Target Plane", McCord and Pease, Journal of Vacuum Science Technology B, vol. 1, No. 3, Jan./Feb. 1985, pp. 198–201.

"Near–Field Optics: Microscopy, Spectroscopy, and Surface Modification Beyond the Diffraction Limit", Betzig and Traufman, Science, vol. 257, Jul. 1992, pp. 189–195.

"Direct Aerial Image Measurement as a Method of Testing High Numerical Aperture Microlithographic Lenses", Partlo et al., Journal of Vacuum Science Technology B, vol. 6, No. 11, Nov./Dec. 1993, pp. 2686–2691.

"Moire Technique for Overlay Metrology", Brunner and Smith, SPIE Integrated Circuit Metrology II, vol. 480, 1984, pp164–170.

"In Situ Resolution and Overlay Measurement on a Stepper", Brunner and Allen, SPIE Micron and Submicron Integrated Circuit Metrology, vol. 565, 1985, pp. 6–13.

"Growth of Low–Defect Density in 0.25Ga0.75As on GaAs by Molecular Beam Epitaxy", Pickrell et al., Journal of Vacuum Science Technology B, vol. 6, No. 18, Nov./Dec. 2000, pp. 2611–2614.

"Super–Resolved Surface Reconstruction From Multiple Images", Cheeseman et al., Technical Report FIA–94–12, NASA Ames Research Center, Dec. 1994.

"Monolithic Detector Array Comprised of >1000 Aerial Image Sensing Elements", Kunz et al., To be published in the SPIE Proceeding of the Microlithography, 2003.

* cited by examiner

LOW TEMPERATURE DEPOSITION OF DIELECTRIC MATERIALS IN MAGNETORESISTIVE RANDOM ACCESS MEMORY DEVICES

BACKGROUND OF THE INVENTION

A magnetic memory element in a magnetoresistive random access memory (MRAM) semiconductor device has a structure that includes ferromagnetic layers separated by a non-magnetic layer. Information is stored as directions of magnetization vectors in the magnetic layers. The resistance between the magnetic layers depends on the relative orientation of their magnetization directions (magnetic moments). For example, magnetic vectors in one magnetic layer (the "hard" layer) can be magnetically fixed or pinned, while the magnetic vectors of the other magnetic layer (the "soft" layer) are not fixed and are free to switch, e.g., the magnetic moment of the soft layer can be reversed by application of a small magnetic field in operation of the device. Thus, the MRAM device can operate as a memory storage element or cell wherein the magnetic moments of the two magnetic layers are aligned either parallel to one another or antiparallel to one another. In response to the shifting magnetic states, the magnetic memory element represents two different resistances or potentials, which are read by the memory circuit as either a "1" or a "0" It is the detection of these resistance or potential differences that allows the MRAM to read and write information.

Because MRAM elements rely on layers of ferronagnetic film to store information, and the ability to change the alignment of the magnetic layers within the memory bit structure is the primary means of storing and accessing data in the MRAM, the quality of the thin layers of this structure is critical to the performance of this type of device.

An MRAM device integrates magnetic memory elements and other circuits, such as a control circuit for magnetic memory elements, comparators for detecting states in a magnetic memory element, input/output circuits, and the like. These circuits can be fabricated by Complementary Metal Oxide Semiconductor (CMOS) technology that involves many manufacturing steps to form the electric circuitry which typically consists of n-channel and p-channel transistors and active and ppssive circuit elements. The CMOS process requires high temperature steps that exceed 300° C. for depositing dielectric and metal layers, and annealing implants, for example.

However, magnetic layers employ magnetic materials that require processing below 300° C. in order to prevent detrimental intermixing of the materials that would occur if higher temperatures are employed. In particular, a structure with magnetic layers that have interdiffused has a much reduced capability to shift the magnetic alignment of the magnetic structure. Therefore, the ferromagnetic magnetic layers are usually deposited at a different stage, after formation of the transistors and initial metal layers and circuitry by CMOS processing.

Magnetic memory elements also contain components that, detrimentally, are easily oxidized and are sensitive to corrosion. For example, oxygen contamination of the magnetic layers can pin the magnetic dipoles, not allowing the realignment of the magnetic layers. Therefore, magnetic layers that have been contaminated with oxygen will not perform properly and eventually will corrode.

Accordingly, there is a need for a method of making a magnetoresistive random access memory device that solves the foregoing problems.

SUMMARY OF THE INVENTION

The invention provides a low temperature process for depositing silicon nitride or silicon dioxide dielectric films over magnetically active materials in the manufacture of MRAM devices. In particular, the low temperature process is a plasma enhanced chemical vapor deposition (PECVD) at temperatures that are below the standard PECVD process temperature of approximately 400° C. to 500° C. for deposition of these types of films. More particularly, the dielectric films are deposited at a temperature of about 200° C. to 300° C., preferably about 225° C. to 295° C., more preferably about 250° C. to 290° C. and, especially, 295° C. Employing PECVD at a much lower temperature than the high standard PECVD process temperature for deposition of dielectric films eliminates the negative impact of high temperatures on the magnetic properties of the magnetoresistive storage elements.

The invention also provides the use of a low temperature silicon nitride dielectric film proximate to the magnetically active materials. The use of silicon nitride film has the advantage that it is a reducing material and, by virtue of this property, can prevent degradation of the magnetic films that would take place due to the presence of any residual oxygen or moisture from the manufacturing process. Therefore, the MRAM devices produced by embodiments of the invention method preferably comprise silicon nitride dielectric layers comprising about 35% to about 40% by volume of Si, about 35% to about 45% by volume of N, and about 15% to about 30% by volume of H.

The invention provides a magnetoresistive random access memory device with improved magnetic properties including, but not limited to, an improved GMR (Giant Magnetoresistance) effect, more uniform write/read thresholds, and containing a higher percentage of functional memory bits. For purposes of this disclosure, the term "improved GMR effect" means a higher GMR signal indicating a change in resistance for the aligned and unaligned states of the soft magnetic layer of the MRAM device. The MRAM device is produced by a process in which active circuit elements, such as magnetoresistive memory storage bits, are added to semiconductor substrates that already comprise transistors and other circuitry formed by high temperature processes, such as CMOS or the like.

In order to prevent interdiffusion of the magnetic layers, the magnetoresistive storage material is deposited on a finely planarized initial dielectric layer overlying the semiconductor substrate at a temperature of 300° C. or less, preferably 200° C. or less, more preferably 100° C. or less and, most preferably about 50° C. Following deposition of the magnetic layers, each further step in the process requiring deposition of a layer of metal or of dielectric material is performed at a temperature that preferably does not exceed 300° C. and, more preferably, does not exceed 295° C. That is, the deposition temperature can be about 200° C. to 300° C., preferably about 225° C. to 295° C., more preferably about 250° C. to 290° C. and, especially, 295° C.

In particular, deposition of dielectric layers, after the magnetoresistive storage layers are applied, is by a plasma enhanced chemical vapor deposition (PECVD) process in which parameters such as, but not limited to, the percentage of low radio frequency, the pressure, and the like, have been altered from the standard process, in order to produce dielectric film layers with suitable thickness, uniformity, chemical composition, and minimal surface defects.

Thus, the invention provides a magnetoresistive random access memory device (having improved properties) produced by a process comprising the steps of forming an initial dielectric layer overlying a semiconductor substrate; planarizing the initial dielectric layer; depositing one or more layers of magnetoresistive storage material on the initial dielectric layer at a temperature of, most preferably, about 100° C. or less; forming an electrically-conductive stop layer overlying the magnetoresistive storage material layer; forming a hardmask layer overlying the stop layer, wherein the stop layer and the hardmask layer are deposited at a temperature of about 100° C. to 300° C., preferably about 150° C. to about 250° C., more preferably about 200° C.; etching the stop layer and hardmask layer; patterning the magnetoresistive storage material; forming a dielectric layer overlying the magnetoresistive storage material, wherein the dielectric layer comprises silicon nitride deposited at a temperature of about 200° C. to 300° C.; forming an electrically-conductive metal layer overlying the dielectric layer; forming a passivation dielectric layer overlying exposed deposited layers, wherein the dielectric layer comprises silicon nitride deposited at a temperature of about 200° C. to 300° C.; and annealing the device.

DETAILED DESCRIPTION OF THE INVENTION

Some of the key parameters for MRAM finctionality and device yield pertain to specific properties of the magnetic bit performance. Three parameters that are closely monitored are the following: (i) the resistance of a string of bits—typically, there are 8 bits to a string, although strings can contain 2, 4, 16, or 32 bits; (ii) the write threshold distribution, where the write threshold is defined as the moment when the magnetic fields from the current flowing in the bit string and the current flowing in the word line (metal 2 traces running in close proximity of the bits) conjoin to align the magnetic orientation of the hard and soft layers in the GMR stack; and (iii) the threshold window which is the difference in the write threshold and the threshold of writing the bit with only the field of the word line. (It is expected that the magnetic state of the bit is not disturbed by the flow of current in the word line only when that word line is being used to write an adjacent bit.)

Excessive process temperature introduces a number of problems to these three parameters. The bit string resistance will increase as the layers of the magnetic stack intermix, reducing the low resistance current paths of the pure layers in the stack and increasing the high resistance current paths of the non-uniform alloys that are starting to form. The intermixing of the magnetic layers and the crystal structure changes in the magnetic layers alter the uniformity of the magnetic domains in the bits, thus causing the various domains to change orientation over a wider range of magnetic field strengths, increasing the distributions of the write thresholds. This same mechanism causes the thresholds for transitions due to only the word line current to shift, so that inadvertent writes will occur write/read failures in the fuinction of the chip.

Therefore, embodiments of the processes according to the present invention, and the MRAM devices produced by the processes, employ much lower process temperatures, especially PECVD process temperatures, than those typically used in the industry.

High-density integrated circuits such as Dynamic Random Access Memories (DRAMs) or Static Random Access Memories (SRAMs) are typically comprised of hundreds of thousands or millions of semiconductor devices on a silicon substrate. These high-density integrated circuits can be manufactured using a CMOS process and typically involve the use of multiple layers of vertically stacked metal interconnects. Fabrication of CMOS integrated circuits typically involves many manufacturing steps which include repeated deposition or growth, patterning, and etching of thin films of semiconductor, polysilicon, metal, and dielectric materials to form the electrical circuitry which typically consists of n-channel and p-channel transistors and active and passive circuit elements.

Figure 1:
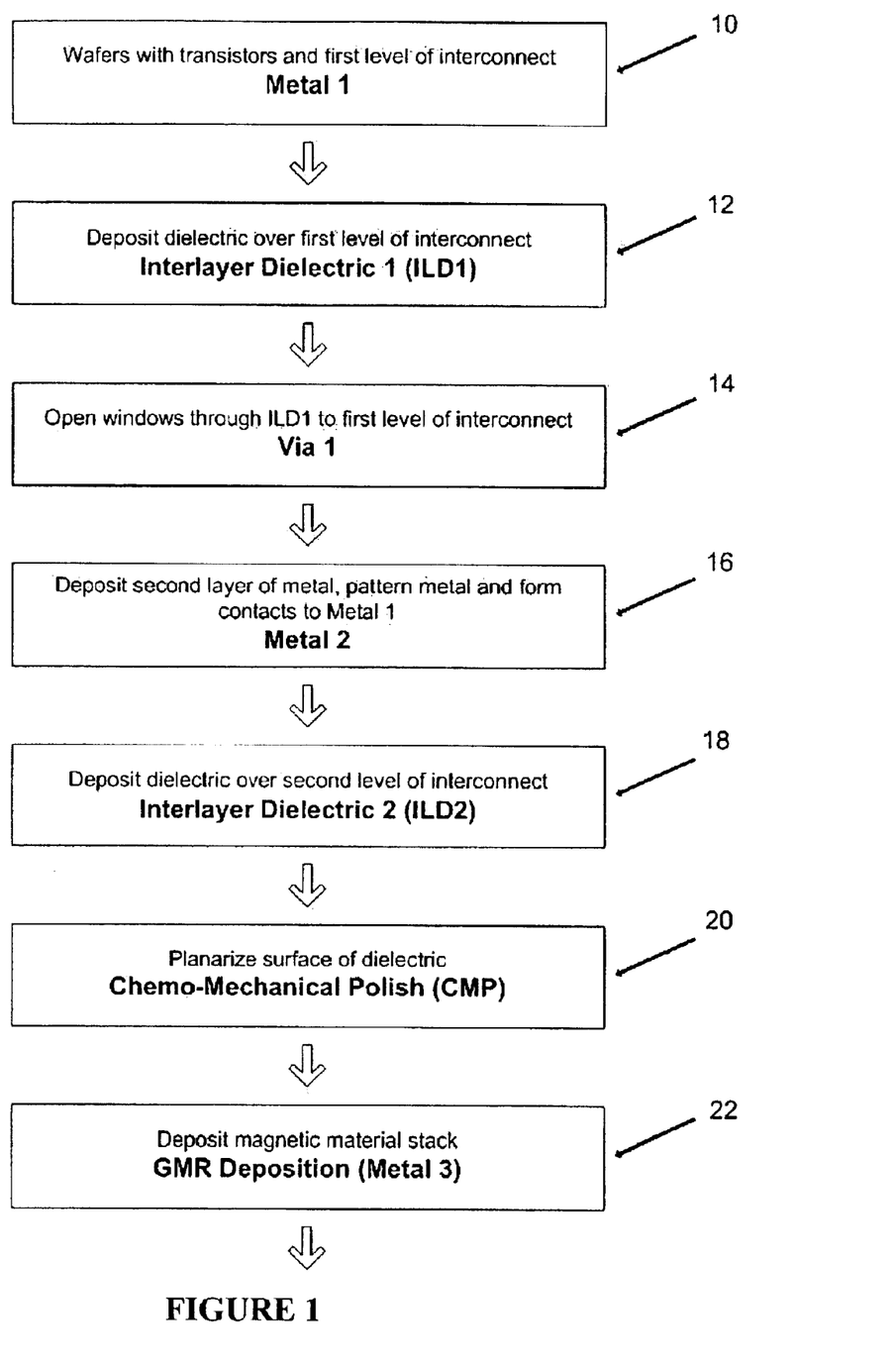
FIG. 1 illustrates the steps of an embodiment of an invention process for forming an MRAM device.

A exemplary CMOS process for forming a semiconductor substrate suitable for use in manufacturing the MRAM device according to the invention is illustrated in the first four method steps (blocks 10, 12, 14 and 16) in FIG. 1. Briefly, steps to form the n-channel and p-channel transistors and associated active or passive circuit elements on a wafer are completed before the first level of interconnect metal is formed. Forming metal interconnect typically requires the repeated steps of deposition or growth, patterning, and etching of metal, via and dielectric layers as necessary to connect the integrated circuit elements. After the n-channel and p-channel transistors have been patterned and etched, a dielectric layer is formed over the surface of the topography to provide dielectric isolation between the devices and the overlying interconnect conducting regions. Next, a contact layer is patterned into the dielectric layer to define openings in the dielectric layer where ohmic contacts will interconnect a first level of metal to the source, drain and gate regions of the n-channel and p-channel transistors. The contact layer patterning is accomplished by first depositing a photoresist layer over the dielectric layer. The photoresist is next selectively exposed to light through a patterned reticle having the desired layer pattern. After exposure, the photoresist is developed to form a resist mask for the desired layer pattern. The exposed layer is then etched to define the contact openings. Then the contact metal is deposited and etched.

Following the above process, the first level of metal (Metal 1, block 10) is deposited, patterned and etched over the contact and dielectric layers. The first level of metal is positioned over the contacts to provide electrical interconnection between the first level of metal and the n-channel and p-channel devices. A second dielectric layer (ILD 1, block 12) is next formed over the patterned first metal layer. After via holes (Via 1, block 14) are formed in the second dielectric layer to provide openings to the first metal layer (Metal 1, block 10), a conductive material, such as tungsten, is deposited to fill the via holes and form 'tungsten plugs." After the tungsten plugs are formed, a second metal layer (Metal 2, block 16) is deposited, patterned and etched over the tungsten plugs and the first dielectric layer. The second layer of metal is positioned over and in physical contact with the tungsten plugs to provide electrical interconnection between the second layer of metal (Metal 2, block 16) and the first layer of metal (Metal 1, block 10). The steps of deposition or growth, patterning, and etching of metal, via and dielectric layers is repeated as desired to provide the necessary interconnect to form the integrated circuit.

According to the present invention, all of the foregoing steps in the manufacture of the semiconductor substrate can be accomplished according to known CMOS technology.

The following steps of the method are then, preferably, performed. Dielectric layers are deposited by plasma enhanced chemical vapor deposition (PECVD), by a process further described below.

In a preferred embodiment of the present invention, an initial dielectric layer (ILD2, block 18) is formed by PECVD to overlie the semiconductor substrate. The thickness of ILD2 can range from about 1500 Å to about 8000 Å, with a preferred range of about 2500 Å to about 4500 Å and, especially, a thickness of about 4000 Å. Because the magnetic layers are to be deposited next, the dielectric layer (ILD2, block 18) must be highly polished and planarized in order to provide the uniform surface required by the very thin films used to form the magnetoresistive layer. Surface roughness of the layer would result in uneven deposition of the magnetic layers, detrimentally impacting the performance of the MRAM. Because silicon dioxide is more easily polished and planarized than silicon nitride, the ILD2 layer is preferably silicon dioxide. The ILD2 layer is planarized using a chemical mechanical polish (block 20).

A magnetic material stack (GMR Deposition, Metal 3, block 22) is then formed to overlie the smooth ILD2 layer. The magnetic material stack includes magnetoresistive material layers, a non-magnetic layer sandwiched between magnetoresistive material layers, and, overlying the magnetoresistive material layers, an initial stop layer, a final stop layer and a hardmask layer. The initial stop layer thickness can range from about 100 Å to about 2000 Å, preferably about 250 Å to about 600 Å and, especially, about 400 Å. The final stop layer can range in thickness from about 200 Å to about 2000 Å, preferably about 300 Å to about 800 Å and, especially, about 600 Å.

The exact composition of the magnetoresistive layer does not directly affect the practice of the present invention, but can include any materials having the property wherein a change in resistance of the material is observed when an external magnetic field is applied. In exemplary embodiments, these materials may include materials used to form Anisotropic Magnetoresistance (AMR) devices, Giant Magnetoresistance (GMR) devices, Colossal Magnetoresistance (CMR) devices, Tunneling Magnetoresistance (TMR) devices, Extraordinary Magnetoresistance (EMR) devices, Very Large Magnetoresistance (VLMR) devices, or the like.

In a preferred embodiment, the magnetoresistive storage layer is formed of materials that form "pseudo" spin valve structures. The magnetoresistive bits are developed through repeated deposition of multiple thin films which may include cobalt, nickel, iron, or the like. For example, the films can comprise, but are not limited to, CoFe, NiFeCo, NiFe, or the like. For example, one layer of magnetic film can serve as a hard magnetic layer, in which magnetization is pinned or fixed, whereas magnetization directions in the second magnetic layer are free. The magnetic layers are separated by a non-magnetic layer, that can comprise any non-magnetic material that does not contain oxygen, so as to avoid oxygen contamination of the magnetic film. For example, the non-magnetic layer can include, but is not limited to, copper, titanium, aluminum, ruthenium, platinum, palladium, or tantalum, or the like.

Each of the magnetic layers and the non-magnetic layers are deposited at an individually selected temperature that is 300° C. or less, preferably 200° C. or less, more preferably 100° C. of less and, especially, about 50° C.

The stop layer(s) can serve as a protective layer for the magnetoresistive storage layer, to minimize disruption of the magnetic layers when they are later etched. The exact composition of the initial stop layer does not directly affect the practice of the present invention, except that it must be electrically conductive. The initial stop layer may include any materials having an etch selectivity that is greater than the etch selectivity of the hardmask layer and the final stop layer. In exemplary embodiments, these materials can include chromium, silicon, and the like.

The final stop layer is deposited to overlie the initial stop layer. The exact composition of the final stop layer does not directly affect the practice of the present invention, but may include any materials that are electrically conductive, inert to chemicals contained in polishing slurries, and having a chemical mechanical polish selectivity that is greater than the chemical mechanical polish selectivity of the hardmask layer. In exemplary embodiments, these materials may include titanium, tungsten, and the like.

The stop layers are deposited at a tempearutre of about 200° C. to 300° C., preferably about 225° C. to 295° C., more preferably about 250° C. to about 290° C. and, especially 295° C.

A hardmask layer is deposited, preferably by PECVD, to overlie the final stop layer. The exact composition of the hardmask layer does not directly affect the practice of the present invention. In exemplary embodiments, this material can include, but is not limited to, silicon dioxide, silicon nitride, or the like but, preferably, comprises silicon dioxide. Because this layer does not directly overlie the magnetic layers, any possible oxygen contamination of the magnetic layers by the silicon dioxide layer is minimized. The hardmask layer is deposited at a temperature of about 100° C. to 300° C., preferably about 150° C. to about 250° C., more preferably about 200° C. The thickness of the hardmask layer can range from about 1000 Å to about 5000 Å, preferably about 1500 Å to about 3500 Å, and especially about 2000 Å.

Most preferably, each of the layers of the magnetic material stack, including the magnetic and non-magnetic layers, the stop layer(s) and the hardmask layer is deposited at a temperature of 300° C. or less, preferably 295° C. or less, to prevent interdiffusion of the magnetic layers that can occur at temperatures of about 325° C. and higher.

The hardmask layer and the stop layer(s) are then etched and the magnetorcsistive storage layer is patterned by, for example, photolithography and/or blanket ion milling or reactive ion etching to form magnetoresistive bits (Bit Photolithography and Etch, block 24) Once the magnetoresistive bits are formed, the bits are typically electrically interconnected as a series of "bit strings," where each bit string may consist of 4, 8 or 16 bits, or the like.

Because the process conditions for deposition of each layer of an MRAM device can impact the properties of the materials that are already present in the given microelectronic structure, the invention method requires that each layer deposited subsequent to the magnetic material stack be deposited at a temperature of about 200° C. to less than 300° C., so as not to cause thermal interdiffusion of the magnetic materials. Moreover, the invention method requires that each layer subsequently deposited does not introduce oxygen to the magnetic materials.

Therefore, a third dielectric isolation layer (ILD3, block 26), having a sufficient thickness to fill in the gaps created by etching, that is deposited over all the exposed surfaces, comprises silicon nitride, deposited at a temperature of about 200° C. to 300° C., preferably about 225° C. to about 295° C., more preferably about 250° C. to about 290° C., especially 295° C. The silicon nitride serves as a reducing substance, such that any oxygen contamination of the previous layers is reversed and reduced by the hydrogen content, as described further below. The thickness range for this dielectric layer must be greater that twice the thickness sum of thicknesses for the magnetic layers, the initial stop material, the final material, and any residual hard mask material, up to a micron of dielectric. The lower limit of this film thickness depends on the topography of the underlying materials and is a thickness sufficient to provide for sufficient planarization of the underlying topography. An exemplary thickness range can be, but is not limited to, about 2200 Å to about 6000 Å, preferably about 3000 Å.

Windows are then opened through the ILD3 layer to the magnetic bits (Bit Via or Bit Contact, block 28) and windows are also opened through the ILD2 layer to the second level of interconnect (Deep Via, block 30). A fourth layer of metal is then deposited (Metal 4, Strap Metal, block 32) and patterned, with interconnects formed to the magnetoresistive storage layer and metal interconnect layers to the electrical circuits. Exemplary metals used for this layer include, but are not limited to, aluminum, titanium, titanium nitride, tungsten, titanium-tungsten, or the like. Preferably, the fourth metal layer is deposited at a temperature of about 200° C. to about 225° C.

Finally, a dielectric passivation (Passivation Dielectric, block 34) layer is deposited, preferably by PECVD, at a temperature of about 200° C. to 300° C. or less, preferably 295° C. or less, to overlie the entire exposed surface of the MRAM device. This layer can be silicon dioxide or silicon nitride but, preferably, this layer is silicon nitride in order to reduce any oxygen or moisture contamination of the previous layers. More preferably, the deposition temperature is about 225° C. to 295° C., most preferably about 250° C. to about 290° C. and, especially 295° C. A preferred thickness range for this layer is about 5000 Å to about 15000 Å and, especially, about 7000 Å.

As a final step, the wafer is annealed in a magnetic field to alight the magnetic moments of the magnetic storage material (Magnetic Anneal, block 36). The annealing step is also performed at a temperature of 300° C. or less.

Figure 2:
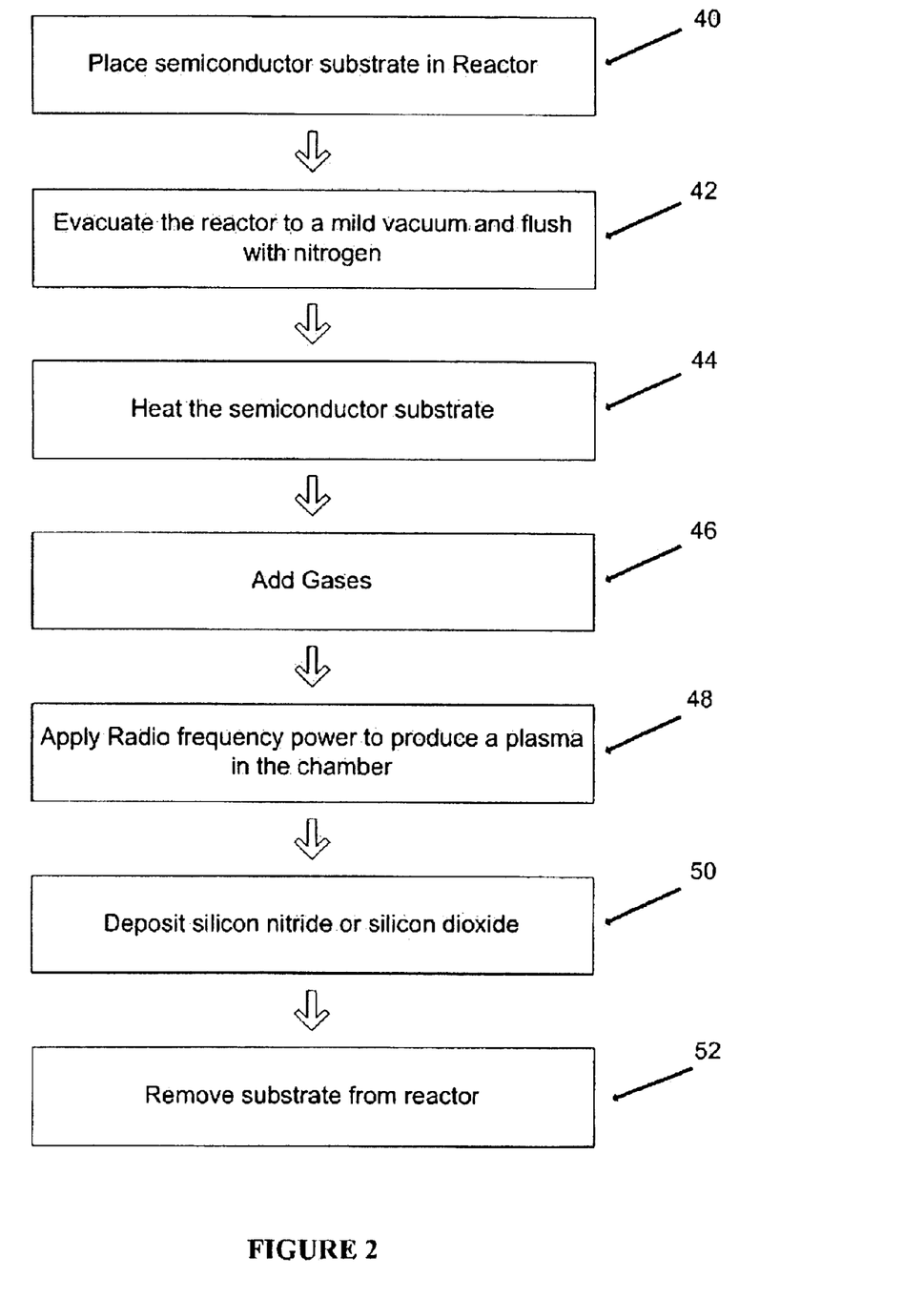
FIG. 2 illustrates steps of an embodiment of a low temperature PECVD process for forming dielectric films in an MRAM device.

An embodiment of the PECVD process for deposition of dielectric films in the manufacture of an MRAM device according to the present invention is illustrated in FIG. 2. Briefly, a first step is the placement of the semiconductor substrate, which contains the magnetoresistive material stack, in the PECVD reactor (block 40). The PECVD reactor is pumped down to about $10^{-3}$ torr to eliminate any oxygen, and is then flushed with nitrogen (block 42). The substrate is heated (block 44) to a temperature of about 200° C. to about 300° C., with 300° C. being the most preferred temperature. Gasses that are used to form silicon nitride or silicon dioxide are fed into the reactor (block 46).

For example, to form a silicon nitride film, the gas can be a mixture of silane ($SiH_4$), ammonia, nitrogen, and the like, and further can include inert gases, such as helium, argon, and the like.

To form a silicon dioxide film, the gas could be a mixture of a gaseous oxidizer silane ($SiH_4$), and inert gases. In addition to silane, other silicon-containing precursors can be used to form silicon dioxide, including disilane ($S_2H_6$) and tetraethoxysilane (TEOS), or the like. All of these processes require mixing the silicon-containing reactant with an oxidizing gas reactant, such as oxygen gas ($O_2$), ozone ($O_3$), nitrous oxide ($N_2O$), nitrogen dioxide ($NO_2$), or carbon dioxide ($CO_2$), or the like.

In a typical PECVD process, a plasma of ionized gas is formed in the reactor. The plasma energizes the reactants, enabling formation of the desired silicon nitride or silicon dioxide at a lower temperature than would be possible by adding only heat to the reactor system. In a typical PECVD process, the plasma is a low pressure reactant gas discharge that is developed in a radio-frequency (RF) or microwave radiation field. The plasma is an electrically neutral ionized gas in which there are equal number densities of electrons and ions. At the relatively low pressures used in PECVD, the electron energies can be quite high relative to heavy particle energies. The high electron energy increases the density of dissociated reactants within the plasma available for reaction and deposition at the substrate surface. The enhanced supply of reactive free radicals in the PECVD reactor enables the deposition of dense, good quality films at lower temperatures and at faster deposition rates than typically achieved using only thermally-activated chemical vapor deposition processes.

Exemplary gas reactants forming the silicon nitride film are illustrated below. In order to drive the reaction to completion (ideal), the required temperature of the reaction during deposition of the film is so high that it would cause either the degradation of an underlying material or the intermixing of underlying materials due to thermal diffusion. It is known that magnetic device structures in an MRAM are comprised of multiple magnetically active layers with conducting layers immediately adjacent to one another. Some of these materials readily mix at standard process conditions used in the microelectronics industry. Therefore, the reactions are typically not driven to completion.

| (Ideal)  | $3SiH_{4\,(g)} + 4NH_{3\,(g)}$ | $Si_3N_{4\,(s)} + 12H_{2\,(g)}$ |
|----------|-------------------------------|---------------------------------|
| (Actual) | $3SiH_{4\,(g)} + 4NH_{3\,(g)}$ | $cSi_xN_yH_{z\,(s)} + dH_{2\,(g)}$ | where c, d, x, y and z are determined by the deposition conditions. The inclusion of hydrogen in the silicon nitride matrix is advantageous in providing a film that has reducing properties. Therefore, the dielectric layers in the MRAM devices according to the invention are preferably silicon nitride containing hydrogen, to reduce any oxygen that may be present that can detrimentally affect the quality of the magnetic materials (block 50). In a preferred embodiment, the silicon nitride layers comprise about 35% to about 40% by volume of Si, about 35% to about 45% by volume of N, and about 15% to about 30% by volume of H.

In an embodiment of the invention, the hardmask layer can be silicon dioxide, deposited in a PECVD process using a silicon bearing organic molecule and oxygen, exemplified by the following reaction:

All dielectric layers following the hardmask layer are preferably silicon nitride, capable of reducing any oxidation of the magnetic materials that might result from the presence of the silicon dioxide layer. (block 50).

The last step in the PECVD method is to remove the substrate from the reactor (block 52).

In an embodiment of a PECVD process according to the invention, exemplary gas flow rates for deposition of silicon nitride can be: $SiH_4$, 0.25 to 0.45 slm (standard liters per minute); $NH_3$, 1.2 to 2.2 slm; He or Ar, 0.5 to 1.5 slm; and $N_2$, 0.5 to 1.5 slm. In another embodiment of a PECVD process according to the invention, exemplary gas flow rates for deposition of silicon dioxide can be: TEOS, 0.9 to 1.5 ml/min; $O_2$, 7.5 to 12.5 slm; He or Ar, 0.5 to 1.5 slm.

The pressure can range from about 0.5 to about 10 torr, with a preferred range of about 1.5 to about 3.0 torr The total radio frequency power can range from about 500 to about 5900 watts, with a preferred range of about 1000 to about 3000 watts.

In a preferred embodiment for producing a silicon dioxide film, the reactor electrode is operated at 100W to 500W and 13.54 MHz.

In a preferred embodiment for producing a silicon nitride film, two radio frequencies are employed. A high radio frequency can be in a range of 13.54 to 13.56 MHz and a low radio frequency can be in a range of 150 kHz to 350 kHz. Preferably, the total radio frequency power is in a range of about 750W to about 1250W. The ratio of high radio frequency power to low radio frequency power can range from 0.1 to 1.0, but preferably is about 0.3 to about 0.4.

Figure 3:
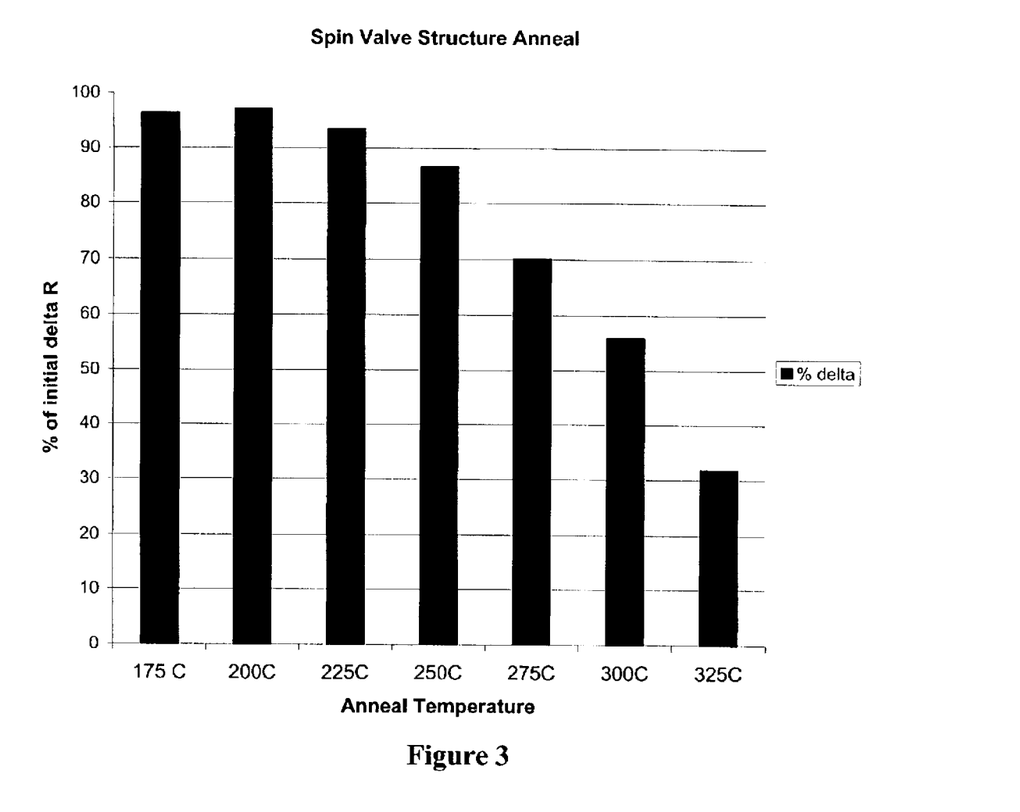
FIG. 3 is a graphic illustration of the degradation in performance of a giant magnetoresistive spin valve as the temperature of the annealing step increases.
Figure 4:
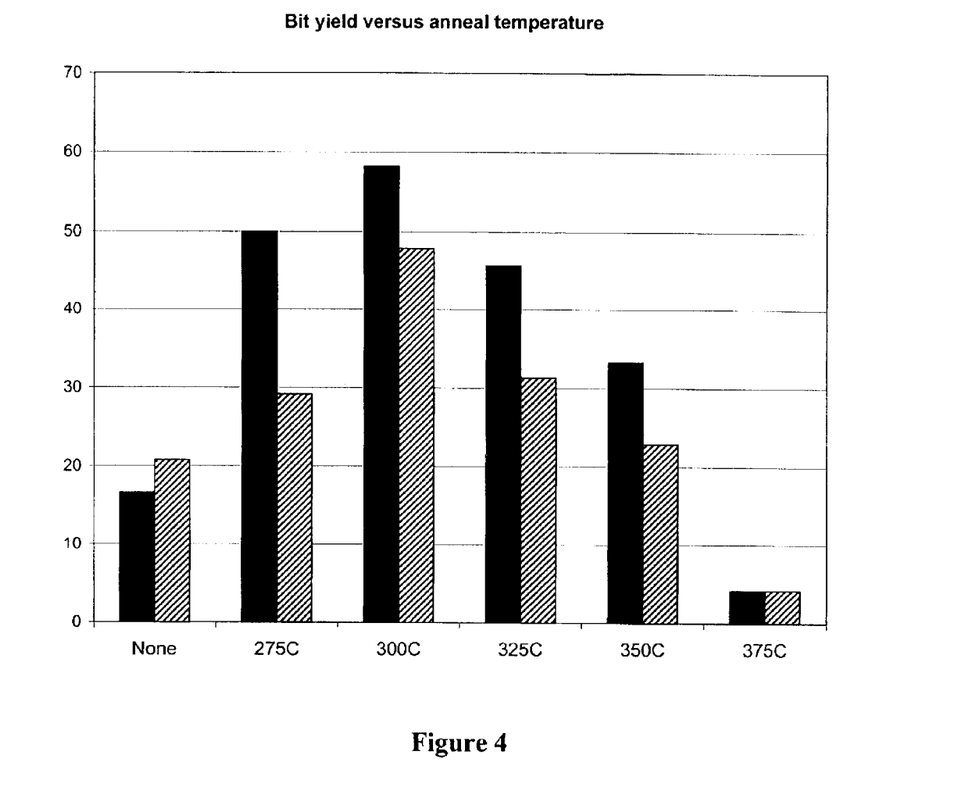
FIG. 4 is a graphic illustration of the percentage loss of operational magnetic bits in two different MRAM devices as the temperature of the annealing step increases to greater than 300° C.

FIGS. 3 and 4 graphically illustrate the effect of temperature on the performance of magnetic devices. FIG. 3 involves a spin valve structure that is similar to the pseudo-spin valve used in the magnetic random access memory. The spin valve structure has a hard layer that is permanently set. This device is used as a sensing device rather than a data storage device because of the inability to write data into the structure. FIG. 3 is a graphic plot of the percentage change in resistance (delta R) as the temperature of the annealing step is increased. That is, the graph indicates the degradation of the change in resistance for the aligned and unaligned states of the soft layer in the spin valve. The GMR effect is maximized for anneals around 200° C. and degrades with increasing temperature.

FIG. 4 illustrates the results of two experiments (solid black and hatched black/white) to determine the best annealing temperature conditions for the pseudo spin valve structure used for the MRAM device. FIG. 4 is a graphic plot of the percentage of memory bits that are functional in the MRAM device versus the temperature of the annealing step. The maximum number of functional bits are obtained at an annealing temperature of 300° C. A reduction in bit yield is seen as the annealing temperature increases above 300° C.

EXAMPLES

The following examples illustrate methods for preparation of MRAM devices according to embodiments of processes according to the invention. However, the examples are not intended to be limiting, as other methods for preparing these devices and different formulations and temperatures can be determined by those skilled in the art, according to the disclosure made hereinabove. Thus, the invention is not limited to the specific process parameters disclosed, nor to any particular ingredient used to form dielectric and other layers. The examples have been provided merely to demonstrate the practice of the subject invention and do not constitute limitations of the invention. Thus, it is believed that any of the variables disclosed herein can readily be determined and controlled without departing from the scope of the invention herein disclosed and described.

In particular, the following examples illustrate the effects of deposition of silicon nitride film or silicon dioxide film on silicon wafers in a Novellus Concept One 200 PECVD reactor.

Example 1

An experiment was designed to evaluate the effects of pressure, total power and percentage low radio frequency power on film stress, deposition rate and uniformity of deposition of silicon nitride on a standard wafer. Gas flows were not varied and remained fixed at 4.0 liters/min $NH_3$, 5 liters/min $SiH_4$ and 1.6 liters/min $N_2$. The temperature was fixed at 300° C. Five wafer batches were run for each of the experiments. The high radio frequency (HF) was 13.56 MHz. The low radio frequency (LF) was 350 kHz.

A comparison run was made using standard PECVD Novellus Concept One 200 reactor conditions at a standard temperature of 400° C., total power of I kilowatt, at 50% LF and a pressure of 2.6 mTorr.

The refractive index, wafer thickness and wafer uniformity was measured with a 1250SE thin film reflectometer manufactured by KLA-Tencor of San Jose, Calif.

The results are illustrated in Table 1. The results indicate that, over the range of conditions explored, the percentage of LF present was the dominant variable controlling stress. Pressure also played a significant role, even though it was only varied slightly.

TABLE 1

| Expt. No. | Total Power (kW) | % LF | Pressure (Torr) | Stress × $E^{09}$ | Deposition Rate (Å/min) | Thickness (Å) | Uniformity (%) |
|---|---|---|---|---|---|---|---|
| 1 | 0.8 | 30 | 2.5 | 1.0254 | 1181 | 4969 | 0.820 |
| 2 | 0.8 | 30 | 2.7 | 1.2850 | 1321 | 5561 | 1.250 |
| 3 | 1.2 | 30 | 2.5 | 0.8114 | 1604 | 6749 | 1.121 |
| 4 | 1.2 | 30 | 2.7 | 1.1998 | 1764 | 7422 | 0.637 |
| 5 | 0.8 | 70 | 2.5 | −2.1170 | 1519 | 6391 | 0.570 |
| 6 | 0.8 | 70 | 2.7 | −1.3538 | 1633 | 6872 | 1.207 |
| 7 | 1.2 | 70 | 2.5 | −1.8414 | 2177 | 9162 | 5.306 |
| 8 | 1.2 | 70 | 2.7 | −1.4440 | 2081 | 8758 | 1.325 |
| 9 | 1 | 50 | 2.6 | −0.0623 | 1761 | 7413 | 0.814 |
| 10 | 1 | 50 | 2.6 | −0.2089 | 1738 | 7313 | 0.668 |
| 11 | 1 | 50 | 2.6 | −0.0797 | 1765 | 7427 | 0.654 |
| Std. (400° C.) | 1 | 50 | 2.6 | −1.500 | 1700 | 7000 | 1.100 |

Example 2

In another experiment, the effects of three different process recipes were evaluated at selected process temperatures on film stress, deposition rate of silicon nitride, uniformity of disposition, refractive index and the number of defects on the surface of the deposited dielectric layer.

The recipes (Processes 1, 1A and 2) varied to determine optimal gas flow rates, RF power ratios and process pressure. The processes were carried out at 300° C., 275° C. and 250° C., using five wafers for each run. The process parameters are listed in Table 2.

The refractive index, wafer thickness and wafer uniformity was measured with a 1250SE thin film reflectometer manufactured by KLA-Tencor of San Jose, Calif. The number of defects deposited over a blanket wafer was measured on surface scanner, Model 6200, manufactured by KLA-Tencor of Mountain View, The film stress was measured on a stress gauge utilizing two lasers of 670 nm and 750 nm wavelengths that scanned the diameter of a wafer before and after the deposition of a blanket film to determine the change in bow of the wafer. Using the change in the wafer bow, plus the material properties of the substrate and the deposited film, an induced stress was calculated. The system used to perform these measurements was a model FLX2320 manufactured by KLA/Tencor of Mountain View, Calif.

As illustrated in Table 2, processes 1 and 1a resulted in undesirable high refractive indices and the tensile nature of stress induced by the dielectric. Metal films are typically tensile films and compressive dielectric films are preferred to counteract the build up of tensile for devices with multiple metal layers. Process 2 provided the best compromise of wafer uniformity, wafer-to-wafer standard deviation, refractive index, with compressive stress.

TABLE 2

| | Stress (x) | Stress/Time | Refract. Index | Wafer Uniformity (%) | Deposition Rate (Å/min) | Thickness (Å) | Range (Å) | Min (Å) | Max (Å) | SD | Defects <0.3 microns |
|---|---|---|---|---|---|---|---|---|---|---|---|
| Process Recipe 1 | | | | | | | | | | | |
| $N_2$     1.0 slm* | | | | | | | | | | | |
| $SiH_4$   0.35 slm | | | | | | | | | | | |
| $NH_3$    1.6 slm | | | | | | | | | | | |
| 300° C. | 2.73E+08 | −1.22E+08 | 2.0879 | 2.32 | 1582 | 6674 | 311 | 6524 | 6835 | 66.1 | 20 |
| 275° C. | 1.08E+08 | 6.27E+08 | 2.0618 | 1.22 | 1727 | 7266 | 178 | 7155 | 7333 | 19.2 | 30 |
| 250° C. | 3.83E+07 | 3.28E+07 | 2.0085 | 1.55 | 1744 | 7340 | 227 | 7218 | 7445 | 37 | 115 |
| Other setpoints | | | | | | | | | | | |
| Total Power  800 W | | | | | | | | | | | |
| HF           480 W | | | | | | | | | | | |
| LF           320 W | | | | | | | | | | | |
| Pressure     2.6 Torr | | | | | | | | | | | |
| Process Recipe 1a | | | | | | | | | | | |
| $N_2$     1.0 slm* | | | | | | | | | | | |
| $SiH_4$   0.35 slm | | | | | | | | | | | |
| $NH_3$    1.6 slm | | | | | | | | | | | |
| 300° C. | 4.84E+08 | 1.67E+09 | 2.1100 | 1.53 | 1416 | 5960 | 182 | 5881 | 6063 | 37.6 | 10 |
| 275° C. | 3.82E+08 | 1.50E+08 | 2.0896 | 0.97 | 1536 | 6465 | 125 | 6392 | 6517 | 18.7 | 137 |
| 250° C. | 1.90E+08 | 1.81E+08 | 2.0381 | 1.10 | 1569 | 6601 | 146 | 6513 | 6658 | 19.5 | 6000+ |
| Other setpoints | | | | | | | | | | | |
| Total Power  800 W | | | | | | | | | | | |
| HF           560 W | | | | | | | | | | | |
| LF           240 W | | | | | | | | | | | |
| Pressure     2.5 Torr | | | | | | | | | | | |
| Process Recipe 2 | | | | | | | | | | | |
| $N_2$     0.6 slm* | | | | | | | | | | | |
| $SiH_4$   0.35 slm | | | | | | | | | | | |
| $NH_3$    1.7 slm | | | | | | | | | | | |
| 300° C. | −2.20E+09 | −2.21E+09 | 2.0132 | 1.43 | 1619 | 6813 | 195 | 6724 | 6919 | 25.5 | 13 |
| 275° C. | −1.84E+09 | −1.92E+09 | 1.9978 | 1.36 | 1731 | 7285 | 198 | 7195 | 7393 | 33.1 | 34 |
| 250° C. | −1.53E+09 | −1.30E+09 | 1.9644 | 1.43 | 1787 | 7519 | 215 | 7429 | 7644 | 22.2 | 29 |
| Other setpoints | | | | | | | | | | | |
| Total Power  800 W | | | | | | | | | | | |
| HF           200 W | | | | | | | | | | | |
| LF           600 W | | | | | | | | | | | |
| Pressure     2.4 Torr | | | | | | | | | | | |

*slm = standard liters/min

Based on the above experiments, it was determined that the preferred parameters for low temperature deposition of dielectric layers of silicon nitride were the following:

$N_2$: 0.6 slm $SiH_4$: 0.35 slm $NH_3$: 1.7 slm

Power: HF 200 W, LF 600 W

HF: 13.56 MHz

LF: 263 kHz

Temperature: 300° C.

Pressure: 2.4 Torr

Deposition Rate: 1500 Å/min

Silicon nitride film deposited by PECVD, produced under the above process conditions, has the following properties:

Thickness: 2553 Å±18.6 Å
SD %: 2.1%
Refractive Index: 2.0360

Example 3

By experimental runs similar to those performed above to produce silicon nitride dielectric layers, it was determined that silicon dioxide layers can be deposited under the following preferred conditions:

$O_2$: 10.0 slm
TEOS: 1.2 ml/min
Power: HF 200 W, LF 800 W
HF: 13.56 MHz
LF: 263 kHz
Temperature: 300° C.
Pressure: 2.4 Torr
Deposition Rate: 2700 Å/min The silicon dioxide film produced by PECVD, under the above process conditions, has the following properties:

Thickness: 2012 Å±17.43 Å
SD %: 1.9%
Refractive Index: 1.4555

Example 4

The percentages of silicon, nitrogen, hydrogen and oxygen were determined for silicon nitride and silicon dioxide dielectric films manufactured by the processes above, according to the thickness of the films produced. Thin film analysis of the samples was performed by Advanced Materials Engineering Research, Inc., Sunnyvale, Calif, using standard methodology. The results are illustrated in Table 3.

TABLE 3

| Sample | Deposition Temperature (° C.) | Thickness (Å) | Si (%) | N (%) | H (%) | O (%) |
|---|---|---|---|---|---|---|
| Silicon nitride | 300 | 6500 | 36 | 38 | 25 | BDL* |
| Silicon nitride | 300 | 7000 | 37 | 38 | 24 | " |
| Silicon nitride | 350 | 6200 | 38 | 40 | 21 | " |
| Silicon nitride | 400 | 10700 | 38 | 43 | 18 | " |
| Silicon nitride | 300 | 11000 | 39 | 36 | 25 | " |
| Silicon nitride | 300 | 10000 | 38 | 37 | 25 | " |
| Silicon dioxide | 300 | 8000 | 29 | BDL | 9 | 61 |

*BDL = below detection limit

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have elements that do not differ from the literal language of the claims, or if they include equivalent elements with insubstantial differences from the literal language of the claims.

We claim:

1. A magnetoresistive random access memory device with improved magnetic properties produced by a process comprising the steps of:
   (a) forming an initial dielectric layer overlying a semiconductor substrate;
   (b) planarizing the initial dielectric layer;
   (c) depositing one or more layers of magnetoresistive storage material on the initial dielectric layer at a temperature of 300° C. or less;
   (d) forming an electrically-conductive stop layer overlying the magnetoresistive storage material layer;
   (e) forming a hardmask layer overlying the stop layer, wherein the stop layer and the hardmask layer are deposited at a temperature of about 100° C. to 300° C.;
   (f) etching the stop layer and hardmask layer;
   (g) patterning the magnetoresistive storage material;
   (h) forming a dielectric layer overlying the magnetoresistive storage material, wherein the dielectric layer comprises silicon nitride deposited at a temperature of about 200° C. to 300° C.;
   (i) forming an electrically-conductive metal layer overlying the dielectric layer;
   (j) patterning the metal layer;
   (k) forming a passivation dielectric layer overlying exposed deposited layers, wherein the dielectric layer comprises silicon nitride deposited at a temperature of about 200° C. to 300° C.; and
   (l) annealing the device in a magnetic field to align magnetic moments, wherein the annealing takes place at a temperature of about 200° C. to 300° C.

2. The memory device of claim 1, wherein the initial dielectric layer is selected from the group consisting of silicon nitride and silicon dioxide.

3. The memory device of claim 2, wherein the initial dielectric layer is silicon dioxide.

4. The memory device of claim 1, wherein the magnetoresistive storage material is deposited on the initial dielectric layer at a temperature of 200° C. or less.

5. The memory device of claim 1, wherein the magnetoresistive storage material is deposited on the initial dielectric layer at a temperature of 100° C. or less.

6. The memory device of claim 1, wherein the magnetoresistive storage material is deposited on the initial dielectric layer at a temperature of about 50° C.

7. The memory device of claim 1, wherein the hardmask layer is selected from the group consisting of silicon nitride and silicon dioxide.

8. The memory device of claim 7, wherein the hardmask layer comprises silicon dioxide.

9. The memory device of claim 1, wherein the hardmask layer is deposited by PECVD.

10. The memory device of claim 1, wherein the hardmask layer is deposited at a temperature of about 150° C. to about 250° C.

11. The memory device of claim 1, wherein the hardmask layer is deposited at a temperature of about 200° C.

12. The memory device of claim 1, wherein the dielectric layers are deposited by PECVD.

13. The memory device of claim 12, wherein the dielectric layers are deposited at a temperature individually selected from about 225° C. to about 295° C.

14. The memory device of claim 13, wherein the dielectric layers are deposited at a temperature of 295° C.

15. The memory device of claim 13, wherein the dielectric layers are deposited at a temperature individually selected from about 250° C. to about 290° C.

16. The memory device of claim 1, wherein the silicon nitride dielectric layers comprise about 35% to about 40% by volume of Si, about 35% to about 45% by volume of N, and about 15% to about 30% by volume of H.

17. The memory device of claim 1, wherein the improved magnetic properties are selected from the group consisting of a higher GMR signal, more uniform write/read thresholds, a higher percentage of functional memory bits, and combinations thereof.

18. A method of manufacturing a magnetoresistive random access memory device having improved magnetic properties, comprising the steps of:
(a) forming an initial dielectric layer overlying a semiconductor substrate;
(b) planarizing the initial dielectric layer;
(c) depositing one or more layers of magnetoresistive storage material on the initial dielectric layer at a temperature of 300° C. or less;
(d) forming an electrically-conductive stop layer overlying the magnetoresistive storage material layer;
(e) forming a hardmask layer overlying the stop layer, wherein the stop layer and the hardmask layer are deposited at a temperature of about 100° C. to 300° C.;
(f) etching the stop layer and hardmask layer;
(g) patterning the magnetoresistive storage material;
(h) forming a dielectric layer overlying the magnetoresistive storage material, wherein the dielectric layer comprises silicon nitride deposited at a temperature of about 200° C. to 300° C.;
(i) forming an electrically-conductive metal layer overlying the dielectric layer;
(j) patterning the metal layer;
(k) forming a passivation dielectric layer overlying exposed deposited layers, wherein the dielectric layer comprises silicon nitride deposited at a temperature of about 200° C. to 300° C.; and
(l) annealing the device in a magnetic field to align magnetic moments, wherein the annealing takes place at a temperature of about 200° C. to 300° C.

19. The method of claim 18, wherein the initial dielectric layer is selected from the group consisting of silicon nitride and silicon dioxide.

20. The method of claim 19, wherein the initial dielectric layer is silicon dioxide.

21. The method of claim 18, wherein the magnetoresistive storage material is deposited on the initial dielectric layer at a temperature of 200° C. or less.

22. The method of claim 18, wherein the magnetoresistive storage material is deposited on the initial dielectric layer at a temperature of 100° C. or less.

23. The method of claim 18, wherein the magnetoresistive storage material is deposited on the initial dielectric layer at a temperature of about 50° C.

24. The method of claim 18, wherein the hardmask layer is selected from the group consisting of silicon nitride and silicon dioxide.

25. The method of claim 24, wherein the hardmask layer comprises silicon dioxide.

26. The method of claim 18, wherein the hardmask layer is deposited by PECVD.

27. The method of claim 18, wherein the hardmask layer is deposited at a temperature of about 150° C. to about 250° C.

28. The method of claim 18, wherein the hardmask layer is deposited at a temperature of about 200° C.

29. The method of claim 18, wherein the dielectric layers are deposited by PECVD.

30. The method of claim 18, wherein the dielectric layers are deposited at a temperature individually selected from about 225° C. to about 295° C.

31. The method of claim 30, wherein the dielectric layers are deposited at a temperature of 295° C.

32. The method of claim 30, wherein the dielectric layers are deposited at a temperature individually selected from about 250° C. to about 290° C.

33. The method of claim 18, wherein the silicon nitride dielectric layers comprise about 35% to about 40% by volume of Si, about 35% to about 45% by volume of N, and about 15% to about 30% by volume of H.

34. The method of claim 18, wherein the improved magnetic properties are selected from the group consisting of a higher GMR signal, more uniform write/read thresholds, a higher percentage of functional memory bits, and combinations thereof.

* * * * *